(12) United States Patent
Brunschwiler et al.

(10) Patent No.: US 10,098,241 B2
(45) Date of Patent: Oct. 9, 2018

(54) PRINTED CIRCUIT BOARD WITH EDGE SOLDERING FOR HIGH-DENSITY PACKAGES AND ASSEMBLIES

(71) Applicant: International Business Machines Corporation, Armonk, NY (US)

(72) Inventors: Thomas Brunschwiler, Rueschlikon (CH); Andreas Doering, Rueschlikon (CH); Ronald P. Luijten, Rueschlikon (CH); Stefano S. Oggioni, Rueschlikon (CH); Joerg-Eric Sagmeister, Rueschlikon (CH); Patricia Sagmeister, Rueschlikon (CH); Martin Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 14/921,749

(22) Filed: Oct. 23, 2015

(65) Prior Publication Data
US 2017/0118839 A1    Apr. 27, 2017

(51) Int. Cl.
*H05K 3/40*      (2006.01)
*H05K 3/36*      (2006.01)
(Continued)

(52) U.S. Cl.
CPC .......... *H05K 3/403* (2013.01); *H05K 3/366* (2013.01); *H05K 1/141* (2013.01); *H05K 1/145* (2013.01);
(Continued)

(58) Field of Classification Search
CPC ................................ H05K 3/403; H05K 3/366
See application file for complete search history.

(56) References Cited

U.S. PATENT DOCUMENTS 4,288,841 A * 9/1981 Gogal ............... H01L 23/49822
174/534
4,963,974 A * 10/1990 Ushio .................... C23C 18/44
174/250
(Continued)

OTHER PUBLICATIONS

Polzer et al., "3D Integrated Packaging Approach for High Peformance Processor-Memory Module", IMAPS_2013, May 3, 2013, pp. 1-6.

*Primary Examiner* — David M Sinclair
*Assistant Examiner* — Robert Brown
(74) *Attorney, Agent, or Firm* — Scully, Scott, Murphy & Presser, P.C.; Daniel Morris, Esq.

(57) ABSTRACT

The present invention is notably directed to a printed circuit board, or PCB. This PCB has two main surfaces, each delimited by lateral edges, as well as lateral surfaces, each meeting each of the two main surfaces at one lateral edge. The present PCB further comprises a row of solder pads, which extends along a lateral edge of the PCB. Each solder pad is formed directly at the lateral edge and/or directly on a lateral surface (meeting one of the two main surfaces at said lateral edge). I.e., each pad interrupts a lateral edge and/or an adjoining lateral surface. One or more chips, e.g., memory chips, can be mounted on such a PCB to form an IC package. The above solder pad arrangement allows particularly dense arrangements of IC packages to be obtained. The present invention is further directed to related devices and methods of fabrication thereof.

13 Claims, 7 Drawing Sheets

(51) Int. Cl.
*H05K 1/14* (2006.01)
*H05K 3/46* (2006.01)

(52) U.S. Cl.
CPC ..... *H05K 3/4691* (2013.01); *H05K 2201/055* (2013.01); *H05K 2201/09181* (2013.01)

(56) References Cited

U.S. PATENT DOCUMENTS

| | | | | |
|---|---|---|---|---|
| 5,140,745 A | * | 8/1992 | McKenzie, Jr. | H01L 21/486 174/263 |
| 5,166,773 A | * | 11/1992 | Temple | H01L 23/04 174/533 |
| 6,246,016 B1 | * | 6/2001 | Roessler | H01L 23/49805 174/261 |
| 6,501,166 B2 | * | 12/2002 | Wood | H01L 23/50 257/664 |
| 6,534,726 B1 | * | 3/2003 | Okada | H01L 23/49805 174/260 |
| 7,009,848 B2 | * | 3/2006 | Ruckerbauer | H05K 1/14 361/679.32 |
| 7,200,023 B2 | * | 4/2007 | Foster, Sr. | G11C 5/04 365/189.05 |
| 7,348,219 B2 | * | 3/2008 | Kim | G11C 5/04 257/E21.499 |
| 7,803,020 B2 | * | 9/2010 | Crane, Jr. | G06F 1/186 439/108 |
| 7,903,409 B2 | * | 3/2011 | Patel | G06F 1/20 361/700 |
| 7,919,717 B2 | * | 4/2011 | Braman | H05K 3/3405 174/262 |
| 7,952,873 B2 | * | 5/2011 | Glahn | H05K 7/1404 165/104.33 |
| 8,040,683 B2 | * | 10/2011 | Karabatsos | H01R 12/62 361/785 |
| 8,189,342 B2 | | 5/2012 | Bang et al. | |
| 8,288,791 B2 | * | 10/2012 | Bogner | H01L 23/49805 257/680 |
| 8,427,833 B2 | * | 4/2013 | Barowski | H01L 23/481 257/691 |
| 2003/0131472 A1 | * | 7/2003 | Cheng | H05K 3/403 29/840 |
| 2007/0045815 A1 | * | 3/2007 | Urashima | H05K 1/0231 257/698 |
| 2007/0062727 A1 | * | 3/2007 | Braman | H05K 3/3405 174/261 |
| 2007/0158799 A1 | * | 7/2007 | Chiu | H01L 23/49805 257/678 |
| 2008/0084225 A1 | * | 4/2008 | Salehi | G01R 31/2818 324/755.08 |
| 2008/0106288 A1 | * | 5/2008 | Rosenblatt | G01R 31/2818 324/754.03 |
| 2008/0316712 A1 | * | 12/2008 | Pauley | H05K 1/0203 361/721 |
| 2009/0230420 A1 | * | 9/2009 | Bogner | H01L 23/49805 257/99 |
| 2009/0283312 A1 | * | 11/2009 | Takahashi | H01L 24/24 174/260 |
| 2011/0051351 A1 | * | 3/2011 | Harashima | H05K 1/117 361/679.31 |
| 2011/0143579 A1 | * | 6/2011 | Karabatsos | H01R 12/62 439/485 |
| 2011/0149543 A1 | * | 6/2011 | Kamoi | H05K 1/141 361/803 |
| 2013/0058050 A1 | * | 3/2013 | McKenney | G06F 1/185 361/728 |
| 2013/0058148 A1 | | 3/2013 | Cantle et al. | |
| 2013/0077232 A1 | * | 3/2013 | Nordin | H05K 7/20809 361/679.47 |
| 2013/0182400 A1 | * | 7/2013 | Hong | H05K 3/368 361/760 |
| 2013/0194755 A1 | * | 8/2013 | Ling | H05K 7/20545 361/721 |
| 2014/0301052 A1 | * | 10/2014 | Chen | H05K 3/32 361/760 |
| 2015/0136448 A1 | * | 5/2015 | Sasaki | H05K 1/0281 174/251 |
| 2016/0227649 A1 | * | 8/2016 | Lu | H05K 1/117 |

* cited by examiner

PRINTED CIRCUIT BOARD WITH EDGE SOLDERING FOR HIGH-DENSITY PACKAGES AND ASSEMBLIES

BACKGROUND

The invention relates in general to the field of printed circuit boards, or PCBs, integrated circuit packages and assemblies, as well as methods of fabrication thereof. It is, in particular, directed to dense integrated circuit packages and assemblies using integrated circuit chips mounted on PCBs using edge soldering.

Printed circuit boards are used to support and electrically connect various electronic components. PCBs use conductive tracks and contact pads, which are typically etched from a copper sheet laminated onto a non-conductive substrate (typically a FR-4 glass epoxy). PCBs can be single sided or double sided. One also knows multi-layer PCBs, which allow for higher component density.

With ever higher integration and higher speed of microprocessors and memory compact packaging is of high importance, in particular the reduction of wire length between devices. High density interconnect boards have been proposed, which comprise blind and/or buried vias and offer higher circuitry density than traditional circuit boards. Beside, rectangular assembly of PCBs exploit the third dimension, allowing PCBs (or IC packages comprising PCBs) to be placed close to each other. PCBs may for instance be grouped in horizontal or vertical arrangements using sockets to maintain and electrically connect them to, e.g., a base board.

SUMMARY

According to a first aspect, the present invention is embodied as a printed circuit board, or PCB. This PCB can be regarded as a rectangular parallelepiped, exhibiting two main surfaces (the largest surfaces), each delimited by lateral edges, as well as lateral surfaces, each meeting each of the two main surfaces at one lateral edge. Remarkably, the present PCB further comprises one or more rows of solder pads, where each row extends along a lateral edge of the PCB. Each solder pad is formed directly at a lateral edge and/or directly on a lateral surface. I.e., each pad interrupts a lateral edge and/or an adjoining lateral surface, owing to its fabrication process, as discussed below.

One or more chips, e.g., memory chips, can be mounted on such a PCB to form an IC package, according to embodiments of the invention. The above solder pad arrangement allows particularly dense arrangements of IC packages to be obtained.

The edge solder pads obtained can be at least partly housed in blind or through holes, arranged on a main surface of the PCB, and cut open at the level of a lateral surface. Higher connection density can be achieved, however, by housing edge solder pads in blind holes, as blind holes can be provided on each side of the PCB.

According to another aspect, the invention is embodied as an IC assembly, comprising at least two IC packages such as described above, wherein each PCB of the IC packages is soldered to a same board via respective edge solder pads. Such assemblies can accommodate particularly dense arrangement of IC packages.

IC package arrangements as proposed herein may benefit from suitably designed heat dissipating structure, e.g., having a comb structure, wherein thermally conducting layers are intercalated between IC packages of the assembly.

According to still another aspect, the invention is embodied as a method of fabrication of the above PCB. Most simple and efficient is to fabricate the pads from blind or through holes drilled on a main surface of the PCB. In particular, the holes may be filled and/or plated with an electrically conducting material, prior to cutting the PCB along an initial lateral edge, so as for the resulting holes to be cut open at the level of the lateral surface as obtained after cutting, to obtain the pads.

According to yet another aspect, the invention is embodied as a method of fabrication of an IC package such as evoked above, where one or more IC chips are mounted on and electrically connected to a main surface of a PCB.

According to a final aspect, the invention is embodied as a method of fabrication of an IC assembly as discussed above, comprising two or more IC packages, whose PCBs are soldered to a same board via respective edge solder pads.

Devices and fabrication methods embodying the present invention will now be described, by way of non-limiting examples, and in reference to the accompanying drawings.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

The following description is structured as follows. First, general embodiments and high-level variants are described (sect. 1). The next section addresses more specific embodiments and technical implementation details (sect. 2).

1. General Embodiments and High-level Variants

Figure 10:
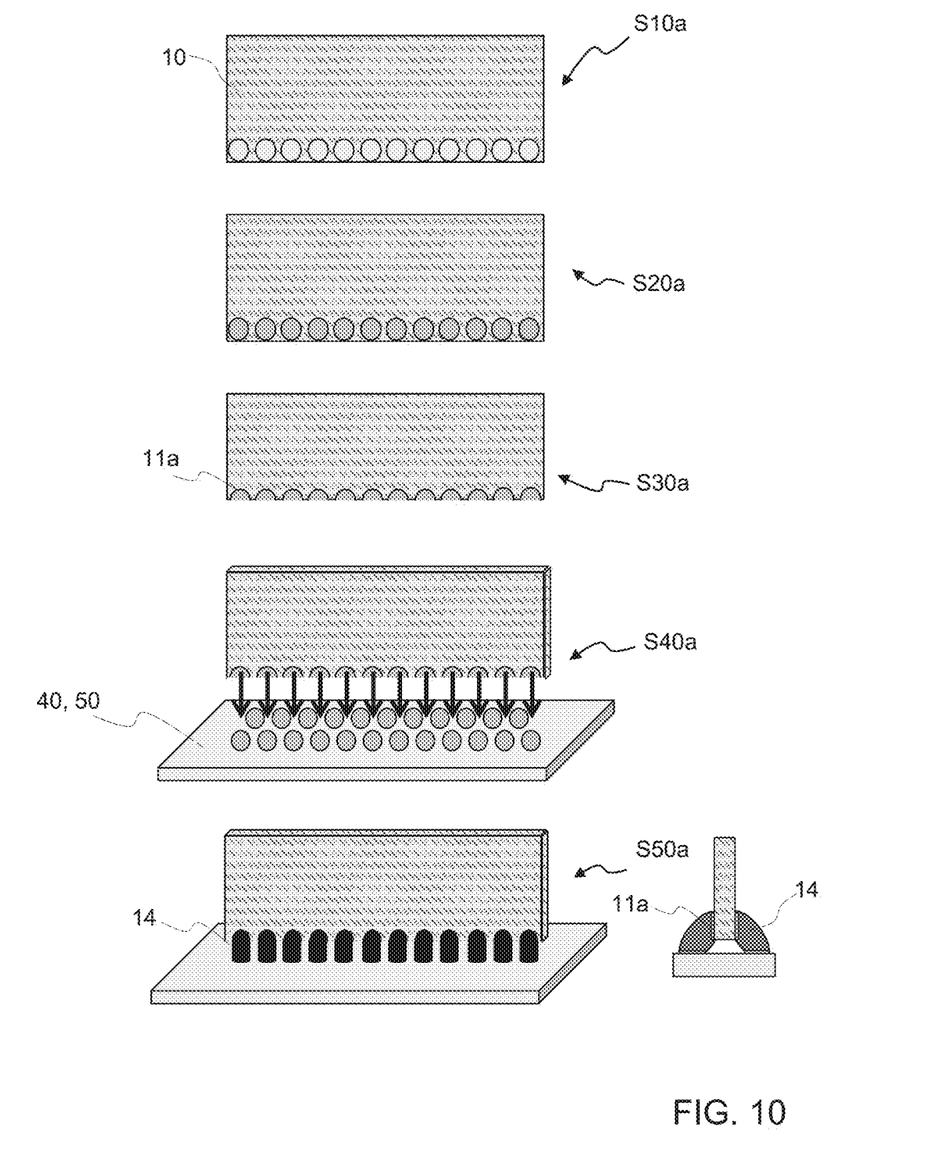
Figure 11A:
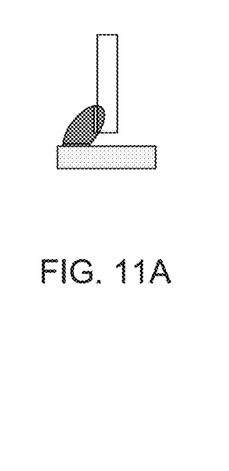
FIG. 11A and FIG. 11B show side views of PCBs connected to a base board, as obtained in a variant to the fabrication method of FIG. 10.
Figure 11B:
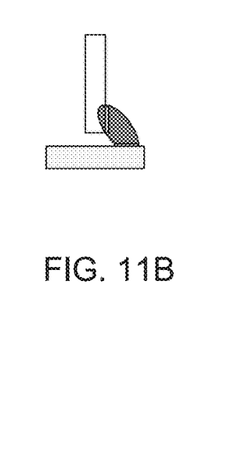
Figure 12:
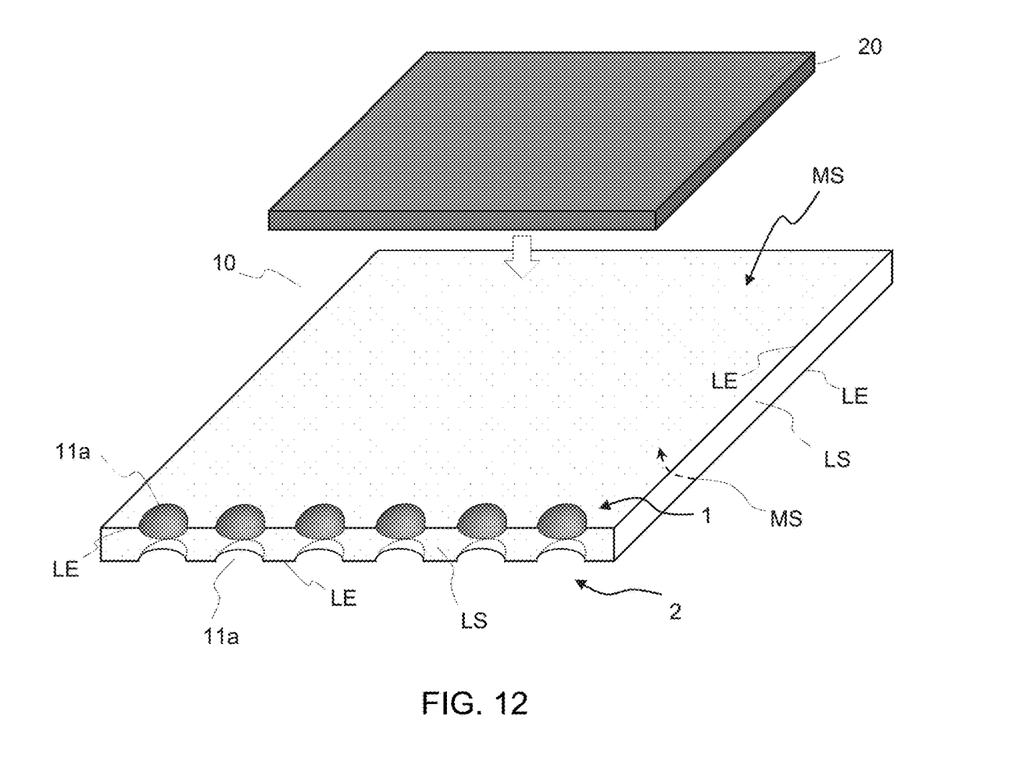
FIG. 12 is a 3D view of a PCB, showing locations of blind holes for fabricating two rows of solder pads on opposite edges of the PCB, as involved in embodiments.

In reference to FIGS. 1-12, particularly to FIG. 12, an aspect of the invention is first described, which concerns a printed circuit board 10, hereafter PCB. This PCB is essentially rectangular; it can be regarded as a rectangular parallelepiped. It accordingly exhibits two main surfaces MS (the largest surfaces, essentially parallel). Each of the main surfaces is delimited by four lateral edges LE and four lateral surfaces LS. Each of the four lateral surfaces meets the main surfaces MS at a lateral edge LE. Of course, real PCBs may have shapes that slightly depart from ideal rectangular boxes'. However, an ideal rectangular parallelepiped (box) may be regarded as a bounding box for a real PCB and the ideal main and lateral surfaces, and lateral edges, as approximations to the real surfaces and edges of the real PCBs.

According to embodiments, a PCB 10 further comprises one or more rows 1, 2 of solder pads 11, 11a, extending along a lateral edge LE of the PCB 10. Namely, each solder pad is formed directly at a lateral edge LE and/or directly on a lateral surface LS. Such solder pads are sometimes referred to as "edge solder pads" in the present document. They make it possible to electrically connect the PCB from the edge to another PCB (to enable data/address signals to flow to/from the PCB via solder joints), a thing that allows, in turn, to obtain dense arrangement of IC package, as notably illustrated in FIGS. 1-8.

In embodiments, two rows of solder pads may be fabricated on opposite edges, on each side of a lateral surface. For instance, the embodiment of FIG. 12 shows two rows 1, 2 of solder pads 11a. The rows 1, 2 extend along opposite edges LE, with each solder pad 11a formed from blind holes, cut at the level of the front lateral surface LS. As a result, each hole interrupts a lateral edge (as well as the adjoining lateral surface in that case).

Note that the word "pad" as used in "solder pad" has no very precise meaning in the PCB-related literature; it is notably used to denote a plated area that is free of solder-stop and can be used as contact. In the present document, a solder pad means any kind of contact, or connection point, suitable for later soldering, i.e., to enable electrical/data signals to flow to/from the PCB via a solder joint, which, in turn, connects to another electronic component or PCB.

As discussed in more detail below, edge solder pads may notably be formed from blind holes or through holes (i.e., vias), arranged on a main surface of the PCB. Owing to the preferred fabrication processes discussed herein, each edge solder pad will be located directly on a lateral edge, so as to be bordered partly by the main surface (on which it is primarily defined) and partly by an adjoining lateral surface. As a result, each solder pad "interrupts" the lateral edge and the adjoining lateral surface in that case.

In (non-preferred) variants, thin holes may be drilled directly from a lateral surface, so as for the resulting holes to be formed directly on a lateral surface. In such a case, the resulting solder pads would line up along a lateral surface, without necessarily touching (i.e., interrupting) the contiguous lateral edges. Such solder pads would, however, be more difficult to fabricate.

Figure 3:
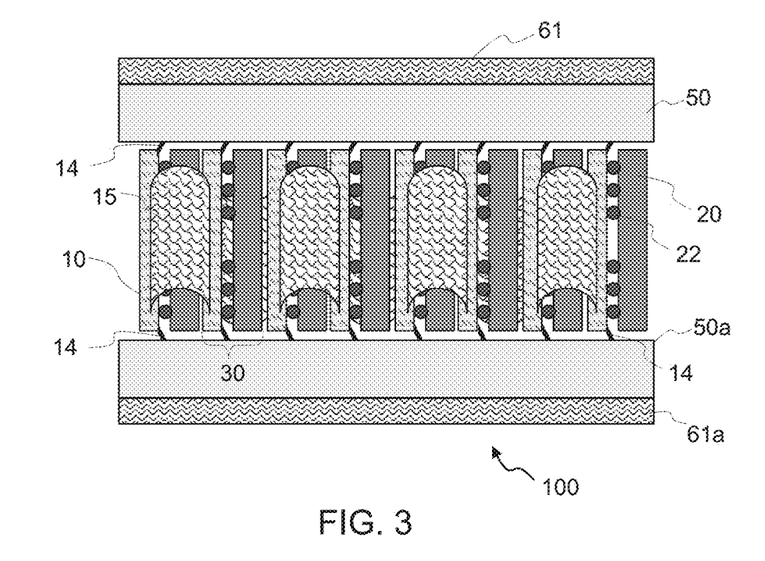
FIGS. 3, and 7 are top views of IC assemblies, according to embodiments.
Figure 4:
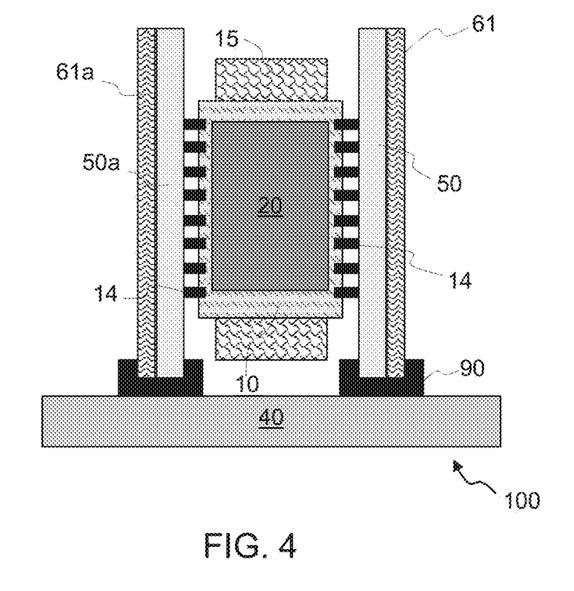
FIG. 4 is a front view of FIG. 3.

One or more chips, e.g., memory chips, can be mounted on such a PCB to form an IC package 30. The present arrangement of solder pads allows particularly dense arrangements of IC packages to be obtained, as depicted in FIGS. 1-8. The lateral, or edge connection enabled by the edge solder pads circumvents the need for sockets to connect the PCBs 10. Such sockets 90 may nevertheless be used in present embodiments, to connect, e.g., a side board to a base board, as depicted in FIGS. 4 and 8. As it can be realized, the dimensions of the sockets 90, which happen to squeeze a PCB, inherently limit the density that can be achieved by piling up PCBs. Instead, using edge solders as proposed herein allows PCBs (or IC packages) to be brought closer to each other and thereby denser IC assemblies to be obtained. If necessary, mechanical reinforcement can be contemplated to improve the mechanical stability of the IC assemblies. However, mechanical reinforcement may be provided by a suitably shaped heat dissipation structure, as discussed later in reference to FIGS. 1, 2, 5 and 6.

Figure 9:
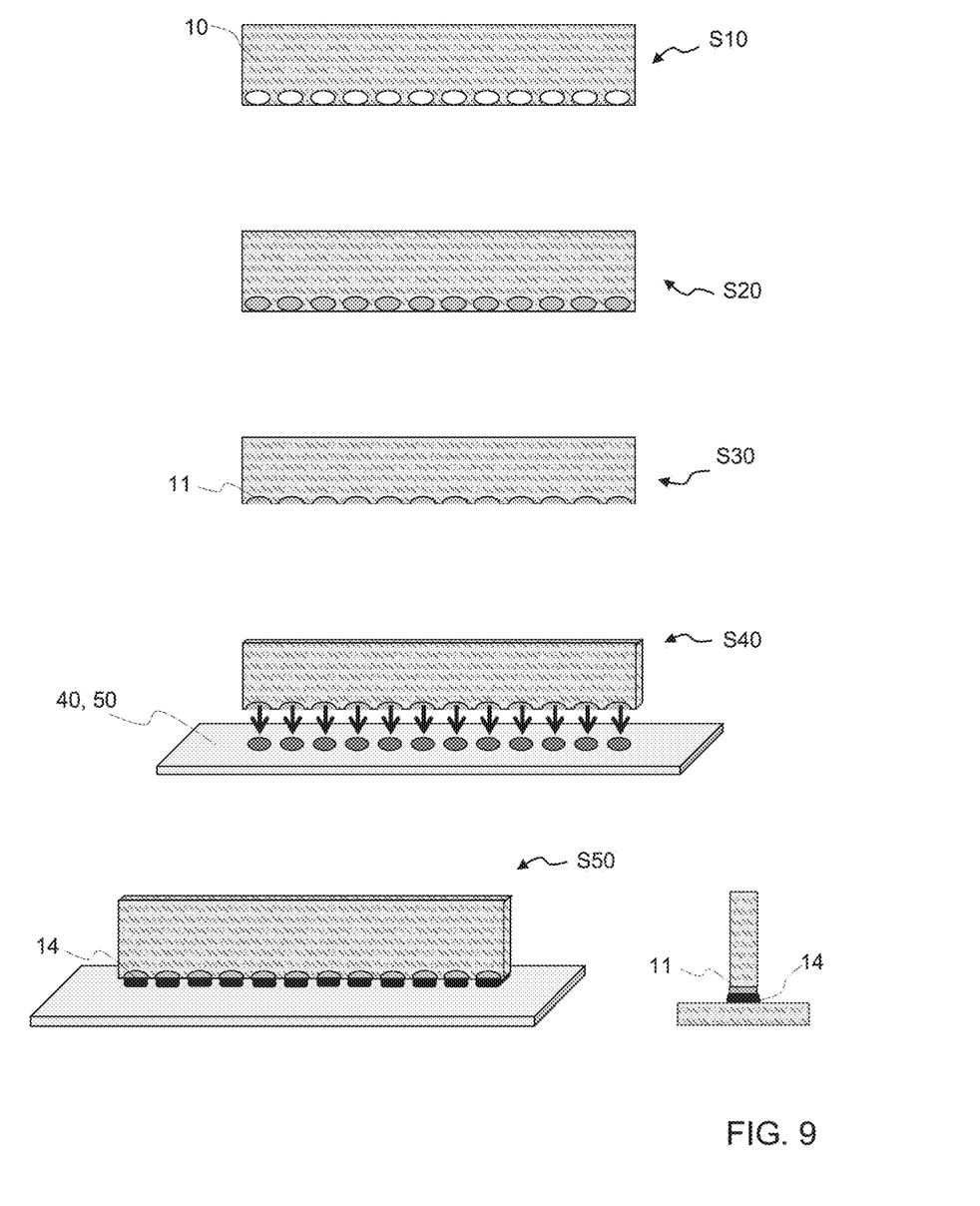
FIGS. 9 and 10 illustrate high-level fabrication steps of PCBs and their vertical soldering to a base board, according to embodiments. The fabrication methods depicted in FIGS. 9 and 10 involve solder pads fabricated as through holes and blind holes, respectively.

Referring now more particularly to FIGS. 9, 10 and 12, each edge solder pad 11, 11a may, in embodiments, be formed from a blind hole or a through hole, provided on a main surface of the PCB and cut open (typically in half), at the level of a lateral surface.

For instance, the embodiment of FIG. 12 shows two rows 1, 2 of solder pads 11a. The rows 1, 2 extend along opposite edges LE, with each solder pad 11a formed as blind holes, cut at the level of the front lateral surface LS. Here, each hole 11a interrupts a lateral edge (as well as the adjoining lateral surface in that case). The plating material is not depicted in FIG. 12, for the intelligibility of the drawing. Yet, each hole 11a depicted in FIG. 12 is meant to be later plated with an electrically conductive material, to form a plated blind hole.

This is illustrated in FIG. 10, where blind holes used to form the edge solder pads are plated with an electrically conductive material, to complete the fabrication of the pads. In variants, such as illustrated in FIG. 9, edge solder pads may initially be formed as through holes, which are then filled with an electrically conductive material, so as to enable an electrical connection from a lateral surface.

Using blind holes, however, makes it possible to provide pads on two sides of the PCB and hence to potentially double the connection density, as illustrated in FIG. 10.

According to another aspect, the invention can be embodied as an integrated circuit package 30, or IC package. Examples of such IC packages can be seen in FIGS. 1-8, as well as in FIG. 12. Basically, a package 30 comprises a PCB 10 as described above and an IC chip 20, mounted on the PCB 10. A main surface of the IC chip 20 faces one of the two main surfaces of the PCB 10 and electrically connects thereto, typically by way of normal solder joints and solder pads, or other electrical contacts, provided on a main surface of the PCB 10. For example, the IC chip may be provided with a Ball Grid Array (BGA) on one side, which is soldered through solder balls to a BGA footprint on the PCB 10.

The IC chip 20 is preferably a memory chip, as mostly assumed in the following. However, any kind of IC chip can be contemplated.

Referring now more particularly to FIG. 8, the IC package 30 may, in embodiments, comprise two or more IC chips 20, each mounted on the PCB 10, such that a main surface of the IC chips 20 faces a main surface of the PCB 10 and electrically connect thereto. Connecting an IC chip to a PCB on their main surfaces, is known per se. Any know mounting process can be contemplated as the edge solder pads 11, 11a do essentially not hamper the mounting The present invention can further be embodied as an IC circuit assembly 100, advantageously comprising several IC packages 30 such as discussed above, as illustrated in FIGS. 1-8. In such IC assemblies, IC packages are superimposed in a direction perpendicular to their main surfaces, i.e., a main surface of an IC package is parallel to and faces a main surface of another IC package in the assembly. Their respective PCBs 10 are edge soldered 14, or laterally soldered to a same board 40, 50, 50a, via respective edge solder pads 11, 11a and solder joints 14. As the solder pads are formed directly at a lateral edge or on a lateral surface of the PCB 10, no space is lost, as would else be the case when using lateral connectors or sockets, so that dense assemblies can be obtained. As evoked earlier, present IC assemblies may for instance be embodied as dense memory bars.

Figure 1:
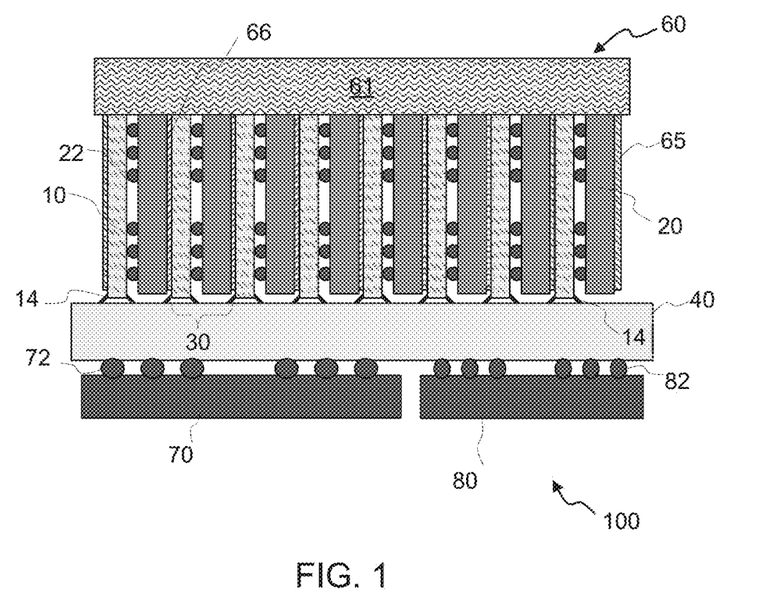
FIGS. 1, 2, 5 and 6 show side views of different IC assemblies, according to distinct embodiments, where the assemblies comprises IC packages and PCBs, also according to embodiments.

In embodiments, the board 40, 50, 50a may be a baseboard 40, or a sideboard or daughterboard 50 connected to a baseboard 40 of the IC assembly 100. Note that the baseboard 40 of FIG. 1 is basically the same as the sideboard 50a of FIG. 4. The baseboard 40 of FIG. 4 differs from the baseboard 40 of FIG. 1 in that two side boards are mounted thereon, via sockets. In addition, the base board 40 of FIG. 1 is a double side board, which comprises additional components 70, 80 mounted on the opposite side and electrically connected via solder balls 72, 82. This allows the IC assembly density to be further increased. These additional components 70, 80 may for instance comprise a memory controller and an interface controller. Additional components such as FPGAs may further be provided, if necessary.

Figure 5:
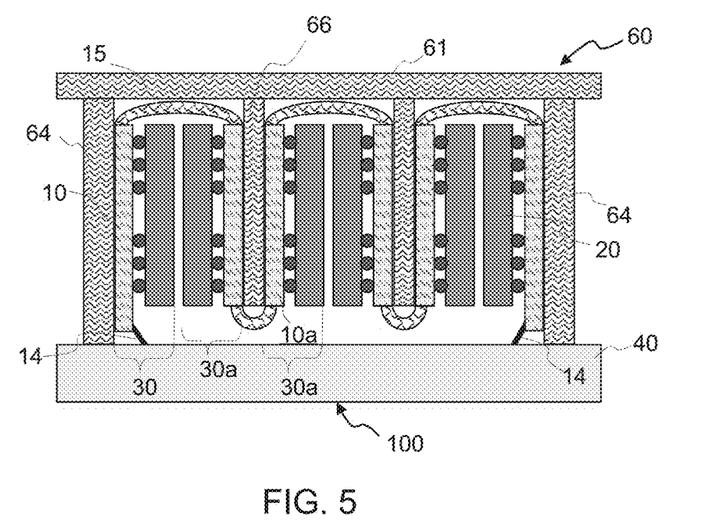
Figure 6:
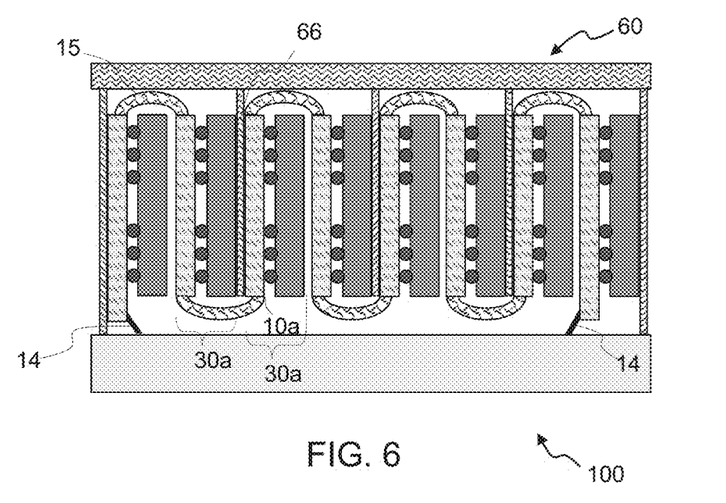

As seen in FIG. 5 or 6, additional IC packages 30a (formed by components 10a and 20) may be provided, between two edge soldered IC packages 30 (formed by components 10 and 20). The additional IC packages 30a need not necessarily be edge/laterally soldered.

Still, as illustrated in FIGS. 3-6, intermediate PCBs 10, 10a (whether edge soldered or not) may electrically connect to a neighboring PCB 10, 10a via a flexible connector or flexible portion 15. Preferably though, rigid-flex PCBs are used to that aim (reference 15 denoting a flexible portion of the PCB in that case), as using flexible connectors would slightly reduce the density of the assembly 100, with respect to rigid-flex PCBs.

Figure 7:
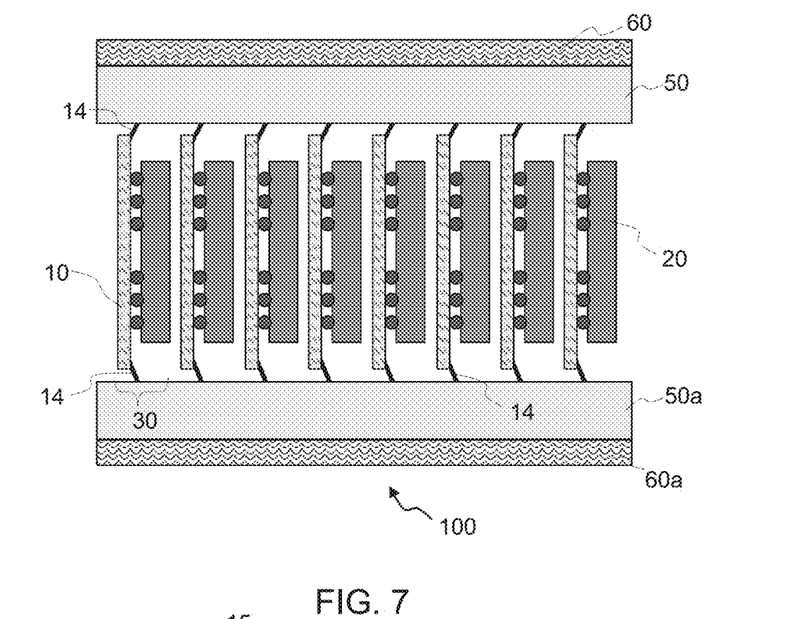
Figure 8:
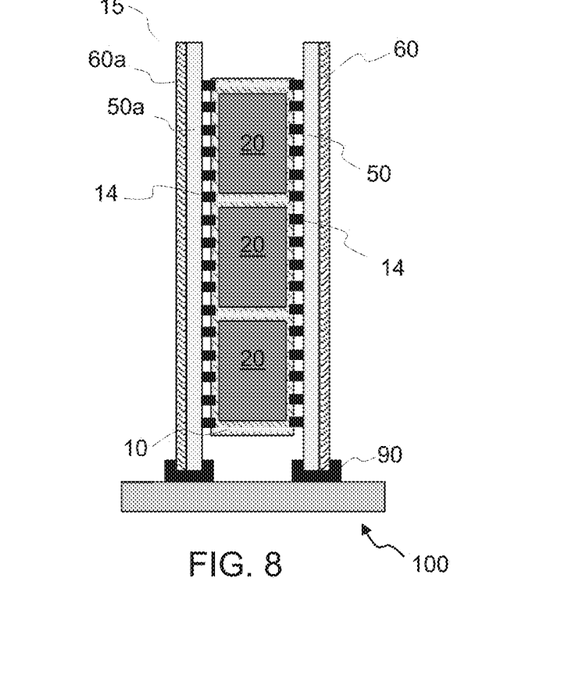
FIG. 8 is a front view of FIG. 7.

In embodiments such as depicted in FIG. 7 or 8, signal communications between the IC packages 30 are solely ensured via the edge solders 14, which connect edge solder pads of PCBs 10 to the boards 50, 50a. On the other hand, in embodiments such as depicted in FIG. 3, signal communications between the IC packages 30 makes use of flexible portions 15 (or connectors), linking neighboring PCBs 10, in addition to edge solders 14 connecting PCBs to side boards 50, 50a. Note that only one side board 50 may be used, instead of two as depicted in FIGS. 3 and 7.

Increasing the package density may pose additional problems in terms of heat dissipation. Therefore, and as illustrated in FIGS. 1, 2, 5 and 6, present IC assemblies 100 may, in embodiments, further include a heat dissipating structure 60. The latter includes thermally conducting layers 62, 65, 66, each intercalated between two IC packages 30, 30a of the IC assembly 100. The thermally conducting layers may for instance be plates, foils or flexible foils (preferably comprising copper). The heat dissipation structure shown in FIGS. 1, 2, 5 and 6 can be regarded as a comb structure with ICs inserted between teeth 62, 65, 66 of the comb. The teeth are connected to a base structure 61 (which itself typically connect to a heat sink, not shown here). Such an arrangement allows to satisfactorily dissipate heat in high-density IC assemblies 100 as proposed herein. The device of FIG. 5 makes use of plates 66, whereas thinner foils are used in the embodiment of FIG. 6.

In the embodiments of FIGS. 1, 2, 5 and 6, the thermally conducting layers (i.e., foils or plates 62, 66) cover, each, an IC chip 20 and/or a main surface of a PCB 10, 10a. The thermally conducting layers may be suitably bonded, glued or compressed between the components they cover.

Figure 2:
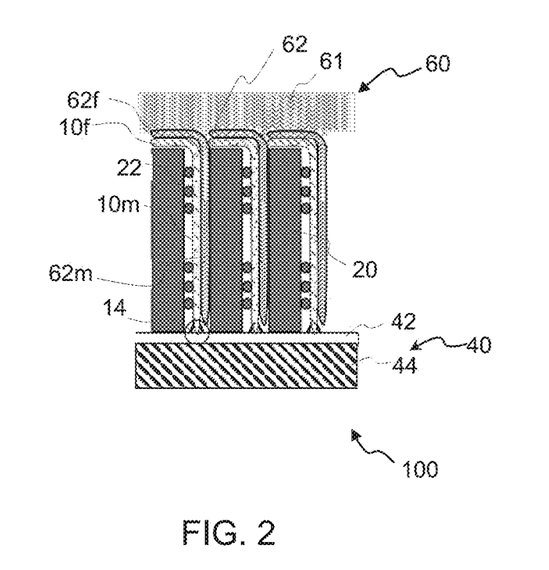

As the IC chips will normally produce more heat than the PCBs, best is for a thermally conducting layer to directly cover an IC chip (as in FIGS. 1, 2). However, other arrangements are possible in which a same layer 66 is in direct contact with two PCBs or, still, with both a chip 20 and a PCB 10, see FIGS. 5 and 6.

Note that, in the embodiments of FIGS. 5, 6, the intermediate conducting layers 66 (intercalated between contiguous IC packages 30a) are made shorter than the outer heat dissipating structures 64. This way, flexible portions of PCBs 15 (or flexible connectors) can be folded around the intermediate layers 66, to enable signal communication to/from the intermediate IC packages 30a, notwithstanding the comb structure and the lack of edge soldering for intermediate IC packages 30a.

More sophisticated designs can be contemplated for heat dissipation. For instance, referring to FIG. 2, the heat dissipating structure 60 may comprise: a rigid structure 61 in thermal communication with the thermally conducting layers 62, which are flexible foils (or heat spreaders) in this example. Each of the foils 62 is bent so as for one portion 62m thereof to cover a main surface of an IC chip 20, whereas a bent portion 62f of the foils 62 is sandwiched between a lateral surface of a neighboring IC chip 20 and the rigid basis structure 61 of the comb 60. In such a case, additional heat dissipation occurs from a lateral surface of the chips 20.

In addition, and as further illustrated in FIG. 2, each of the PCBs of the IC packages may be a rigid-flex or a flexible PCB 10. Still, soldering IC chips onto flexible PCBs may not always be practical, such that rigid-flex PCBs may be preferred. In all cases, a bent portion 62f of the foils may cover a bent portion 10f of a rigid-flex or flexible PCB 10, whereas a straight portion 10m of the PCB is covered by a straight portion 62m of the foil 62, sandwiched between this PCB and an IC chip 20 of an adjacent package. Still, production constraints (e.g., in terms of tolerances) may lead to a gap between the components 62m and 10m. In addition, the bent portion 10f covers a lateral surface of an IC chip 20, so as for the two bent portions 10f, 62f to be sandwiched between a lateral surface of an IC chip 20 and the rigid structure 61. This enables a more efficient heat dissipation from the PCBs as well.

In variants to FIG. 2, the flexible portions 10f and 62f may be folded in opposite directions, e.g., with portion 10f folded on the left (as in FIG. 2) and portion 62f folded on the right (contrary to FIG. 2). However, the flexible portion 10f is clearly optional in that case.

According to still other aspects, the invention can be embodied as methods of fabrication of a PCB 10 such as described above. Exemplary embodiments of such methods are illustrated in FIGS. 9 and 10. Basically, in such fabrication methods, a PCB is provided S10, S10a and a row of solder pads 11, 11a is fabricated S10-S30, S10a-S30a along a lateral edge of the PCB. The fabrication ensures that each solder pad 11, 11a be formed directly at this lateral edge and/or directly on the adjoining lateral surface, according to the specification described earlier.

As further illustrated in FIGS. 9, 10, the fabrication may be carried out as follows. First, a row of holes is fabricated S10-S20, S10a-S20a on one (or each) of the two main surfaces of the PCB provided, so as for this row to extend along an initial lateral edge of the PCB. Second, the PCB is cut S30, S30a along the initial lateral edge (a new lateral edge and a new surface are accordingly obtained), so as for each hole to be cut open at the level of the new lateral surface. The new lateral surface is that surface that meets one of the two main surfaces at the level of the new lateral edge as obtained after cutting.

In the specific embodiment of FIG. 9, through holes are drilled S10 and then filled S20 with an electrically conducting material to obtain temporary pads 11. Note that it may not be necessary to fully fill the through holes. It may for instance be enough to have them plated, provided that the solder used to generate the solder joint (e.g., on a mainboard) is satisfactory enough to establish a contact between the plated material and the solder pad (e.g., on the mainboard). Steps S10 and S20 are advantageously performed prior to cutting S30, which facilitates the fabrication, while leading to clean edges and lateral surface. Still, the filling S20 may be substituted with large solder balls, so step S30 is optional.

In FIG. 10, blind holes are drilled S10a and then plated S20a with an electrically conducting material, prior to cutting S30. Temporary pads are obtained at the lower lateral edges. As evoked earlier, the steps of drilling and plating may be carried out on each of the two main surfaces of the PCB, to obtain two rows 1, 2 of solder pads 11a in fine. Yet, blind holes may be used even where only a one-sided connection is contemplated, as illustrated in FIGS. 11A and 11B In variants (not shown), one may use solder balls (that fit into the cut holes) instead of filling the holes on the baseboard. In still other variants, soldering can be performed with stencils, or by way of usual solder balls or contacts filling the holes. In still other variants, holes may be drilled from a lateral surface, a thing that would, however, complicate the fabrication process. Yet, in each case, the finally obtained solder pads are formed directly at a lateral edge and/or on the adjoining lateral surface, so as for the solder pads to interrupt at least one of the lateral edge and/or the adjoining lateral surface.

Referring now to FIG. 12, the invention can further be embodied as a method of fabrication of an IC package 30, as described earlier. Such a method basically requires to mount an IC chip 20 on the PCB 10, so as for a main surface of the IC chip 20 to face the PCB, and to electrically connect pins, terminals or contacts of the IC chip 20 to corresponding contacts or connection points on the opposite surface of the PCB 10. Usual solder balls 22 (FIGS. 1-3) may be used to that aim.

Finally, the invention may also be embodied as a method of fabrication of an IC assembly 100 such as discussed earlier in reference to FIGS. 1-8. As illustrated in FIGS. 9, 10, such a method uses several IC packages, e.g., fabricated according to the above method. IC chips 20 are first soldered onto the PCBs 10, 10a before mounting the IC packages 30, 30a in the assembly 100. The IC packages are then mounted in vis-à-vis (step S40, S40a in FIGS. 9, 10, where the IC chip is not depicted, for clarity), i.e., so as for a main surface of one IC package to be parallel to and facing a main surface of a neighboring IC package. Finally, each PCB 10 of the IC packages are edge soldered S50, S50a to a same board via a respective row of edge solder pads 11, 11a.

The above embodiments have been succinctly described in reference to the accompanying drawings and may accommodate a number of variants. Several combinations of the above features may be contemplated. Examples are given in the next section, where specific embodiments and technical implementation details are described, in reference to the accompanying drawings.

2. Specific Embodiments/Technical Implementation Details

The present concepts of PCBs, IC packages and assemblies make use of an edge/lateral soldering technique, which allows a substantial increase of IC density. These concepts will notably find applications for memory packages and assemblies. In particular, the present PCBs can be used with any memory or storage components, e.g., DRAM, Flash, PCB, etc. The high-density arrangements disclosed herein may notably be used in 3D memory bar arrangements. More generally, any IC chip may be contemplated to produce IC packages according to embodiments.

Several arrangement options are possible, as illustrated in the accompanying drawings. Notably: horizontally or vertically folded arrangements can be contemplated, using rigid-flex PCBs or flexible connectors in addition to rigid PCBs. PCBs can be horizontally or vertically stacked. Embodiments disclosed herein leverage the rigid-flex technology to reduce the number of solder-balls.

Present designs may furthermore closely integrate heat dissipation structures. In particular, comb structures may be used with intercalated copper plates or copper-foils, for heat dissipation.

For instance, FIG. 1 shows an IC assembly where the solder joints 14 which efficiently use two rows of blind holes on each PCB 10 of each IC package 30. A comb-like, heat dissipating structure 60 has plates 66 intercalated between a memory chip 20 and a neighboring PCB 10, which further ensures mechanical stability. A two-side baseboard 40 is used, which allows additional components 70, 80 such as a memory controller and an interface controller to be mounted on the other side of the board 40.

FIG. 2 depicts a memory bar that comprises a fan of densely arranged small daughter PCBs 10 that are vertically soldered, thanks to edge solders 14, to a base board PCB 40 (reference 42 (denoting a FR-4 glass epoxy layer in this example). One or several memory chips 20 are mounted on top of each daughter PCB 10. Every memory chip is covered with a thin copper foil 62 for heat dissipation purposes. This copper foils are longer then the memory chip 20 itself to establish close contact to the copper top plate 61 through pressure. Stability is ensured by the top copper plate 61 that covers the whole fan. Edge PCB soldering is used to achieve the orthogonal arrangement of the small daughter PCBs and the base board PCB.

In FIGS. 3 and 4, one or several memory chips 20 are mounted on the rigid part of a rigid-flex PCB 10. This string of rigid-flex PCB with memory chips is folded like an accordion and vertically soldered to one or two side boards (one of the two side boards 61, 61a is optional). This embodiment includes thick side copper plates, mounted onto the side board(s), so that heat spreaders for the memory chips are not necessary. The data signals of the memory chips 20 are connected directly to the side board(s) 61, 61a. The address signals are printed in flexible PCB and connected across the folded corners.

In FIGS. 5 and 6, rigid-flex PCBs are used, which are folded around teeth of a copper comb. The latter is configured so as to stabilize the structure. There is no heat spreader covering the memory chips and no side board is necessary here. In FIG. 5, the memory chips are mounted on one side of a rigid-flex PCB and the IC packages are alternated along the assembly. In FIG. 6, the IC packages all have the same orientation; the memory chips are mounted between two rigid-flex PCBs (though connected to one PCB only).

In FIGS. 7 and 8, several memory chips are mounted on a daughter PCB board. No rigid-flex technology is used here, as opposed to the embodiments of FIGS. 2-6. The small daughter PCB board(s) are edge soldered to side boards 50, 50a (one of which is optional). Signal connections can accordingly be done on both sides. Copper plates are mounted on both sides of the memory bar for heat dissipation purposes.

Regarding the fabrication process, the IC chips need to be mounted and soldered before the PCBs 10 are soldered onto the base board or side boards. Components on the base board can be soldered together with the soldering of the PCBs onto the base board or side boards.

In order to avoid melting the solder joints on the daughter or side board when soldering the daughter board to a base board, two options can be contemplated. A first option is to use a dual-temperature soldering. In such a case, the solders for the daughter board have a higher melting temperature than the solder used to connect the daughter board with the base board PCB. A second option is to use a vapor-phase soldering method. Several vapor-phase soldering methods are known, which avoid heating the entire daughter PCB board.

Mechanical fixtures may be used during the soldering process, to maintain the boards being soldered. The fixation angles of the fixtures should preferably allow for vertical movement while they fix the location of the daughter PCB in both the other directions. Depending on the weight of the daughter PCB, one may prefer to use a spring that presses the daughter PCB against the base board. Suitable fixation shapes may for instance be obtained using a 3D printer or die casting.

Once the daughter PCB board is soldered, it may need to be permanently fixated, unless additional structures already in place already take care of that. Indeed, one may leverage larger components such as inductors, or cooling plates to support the daughter PCB mechanically. For example, teeth of a heat dissipating comb structure may be used to provide mechanical stability. Else, one may use traditional fixation methods, such as angles, bolts, or rivets. In addition, also epoxy resin can be injected.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

REFERENCE LIST 1, 2 Solder pad row
10 Printed circuit board, or PCB (small daughter PCB)
100 IC assembly
10a Intermediate PCB
10f Bent portion of rigid-flex PCB
10m Straight (main) portion of rigid-flex PCB
11 Edge solder pad formed from through hole
11, 11a Edge solder pad
11a Edge solder pad formed from blind hole
14 Edge solder joints
15 PCB's flexible portion of rigid-flex PCB
20 IC chip (memory chip)
22, 72, 82 Solder balls
30 IC package
30a Intermediate IC package
40 Base board
50, 50a Side board
60 Heat dissipating structure
61 Basis, rigid structure of heat dissipating structure
62 Thermally conducting foils
62, 66 Thermally conducting (intercalated) layers
62f Foil's bent portion
62m Foil's main (straight) portion
64, 65 Outer thermally conducting plates 64, 65
66 Thermally conducting (intercalated) plates
70 Memory controller
80 Interface controller
LE PCB's lateral edges
LS PCB's lateral surfaces
MS PCB's main surfaces

The invention claimed is:

1. An integrated circuit assembly, or IC assembly, comprising at least two IC packages, each according to the IC package including a printed circuit board (PCB) and an integrated circuit chip, or IC chip, mounted on the PCB, the PCB comprising: two opposite main surfaces, each delimited by lateral edges; and lateral surfaces, each meeting each of the main surfaces at one of the lateral edges, the PCB further comprising: a row of solder pads extending along a lateral edge of the PCB, with each solder pad of the row formed directly at said lateral edge and/or directly on one of the lateral surfaces meeting one of the two main surfaces at said lateral edge; and a main surface of the IC chip facing and electrically connecting one of the two main surfaces of the PCB, and a main surface of one of the at least two IC packages parallel to and facing a main surface of another one of the at least two IC packages, wherein each PCB of the at least two IC packages is edge-soldered to a same board via a respective row of solder pads formed directly at a lateral edge and/or directly on one lateral surface of said each PCB, and said IC assembly further comprising: a third integrated circuit package, or third IC package, between each of said at least two IC packages, wherein the third integrated circuit package comprises a printed circuit board, or PCB, and an integrated circuit chip, or IC chip, mounted on the PCB of the third IC package, a main surface of the IC chip of the third IC package facing and electrically connecting a main surface of the PCB of the third IC package, and a heat dissipating structure comprising one or more thermally conducting layers, each intercalated between an IC package and an adjacent IC package of the IC assembly, wherein one thermally conducting layer provides mechanical and direct thermal contact with a surface of an IC chip of a first IC package and a main non-conducting surface of the adjacent IC package.

2. The PCB of claim 1, wherein
each solder pad of the row is on said one of the two main surfaces and is at least partly housed in a hole cut open at said one of the lateral surfaces, said hole being a blind hole or a through hole.

3. The PCB of claim 2, wherein
each solder pad of the row comprises a blind hole plated, on said one of the two main surfaces, with an electrically conductive material.

4. The PCB of claim 3, wherein
said row of solder pads is a first row, and said lateral edge is a first lateral edge, the PCB further comprising
a second row of solder pads on the opposite one of the two main surfaces, the second row extending opposite to the first row, along a second lateral edge of the PCB, each solder pad of the second row formed on the second lateral edge and comprising a blind hole plated, on said opposite one of the two main surfaces, with an electrically conductive material.

5. The PCB of claim 2, wherein
each solder pad of the row comprises a through hole filled or plated with an electrically conductive material, so as to enable an electrical connection from said one of the lateral surfaces.

6. The integrated circuit package of claim 1, wherein
the IC chip is a memory chip.

7. The integrated circuit package of claim 1, wherein
the IC package comprises two or more IC chips, each mounted on the PCB, a main surface of each of the IC chips facing and electrically connecting one of the two main surfaces of the PCB.

8. The IC assembly of claim 1, wherein
said same board is a baseboard, a sideboard or a daughterboard of the IC assembly.

9. The IC assembly of claim 1, wherein said third IC package is an IC package including a PCB having two opposite main surfaces, each delimited by lateral edges, and lateral surfaces, each meeting each of the main surfaces at one of the lateral edges, the PCB comprising: a row of solder pads extending along a lateral edge of the PCB, with each solder pad of the row formed directly at said lateral edge and/or directly on one of the lateral surfaces meeting one of the two main surfaces at said lateral edge; and an integrated circuit chip, or IC chip, mounted on the PCB, a main surface of the IC chip facing and electrically connecting one of the two main surfaces of the PCB, the third IC package being soldered to said same board via a row of solder pads of the PCB of the third IC package, the row of solder pads formed directly at a lateral edge of the PCB of the third IC package and/or directly on a lateral surface of the PCB of the third IC package.

10. The IC assembly of claim 1, wherein
said thermally conducting plates are, each, thermally conducting foils.

11. The IC assembly of claim 10, wherein
the heat dissipating structure further comprises:
a rigid structure in thermal communication with the thermally conducting layers, the latter being flexible foils, wherein
each of the foils is bent so as for
one portion of the foils to cover a main surface of the IC chip of one of the two neighboring IC packages, and
a bent portion of the foils to be sandwiched between said lateral surface of the IC chip and said rigid structure.

12. The IC assembly of claim 1, wherein
the PCB of the third IC package is electrically connected to a PCB of one or each of said at least two IC packages via a flexible portion of a PCB.

13. The IC assembly of claim 12,
wherein
said flexible portion is folded around one of the thermally conducting layers.

* * * * *